United States Patent
Hwang et al.

(10) Patent No.: US 6,259,642 B1
(45) Date of Patent: Jul. 10, 2001

(54) SEMICONDUCTOR MEMORY DEVICE WITH REDUCED SENSING NOISE AND SENSING CURRENT

(75) Inventors: Sang-joon Hwang; Ho-cheol Lee, both of Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/553,514

(22) Filed: Apr. 20, 2000

(30) Foreign Application Priority Data

Aug. 9, 1999 (KR) .................................................. 99-32583

(51) Int. Cl.$^7$ ....................................................... G11C 7/02
(52) U.S. Cl. ................ 365/206; 365/230.03; 365/230.06
(58) Field of Search ............................... 365/206, 230.03, 365/230.06, 189.01, 230.01

(56) References Cited

U.S. PATENT DOCUMENTS

| | | | |
|---|---|---|---|
| 5,416,748 | * 5/1995 | Fujita | 365/230.06 |
| 6,094,381 | * 7/2000 | Isa | 365/200 |
| 6,111,808 | * 8/2000 | Khang et al. | 365/230.06 |
| 6,118,723 | * 9/2000 | Agata et al. | 365/230.03 |

* cited by examiner

Primary Examiner—Hoai V. Ho
(74) Attorney, Agent, or Firm—F. Chau & Associates, LLP

(57) ABSTRACT

A semiconductor memory device having reduced sensing noise and sensing current by reducing the number of cells activated by a word line is provided. The semiconductor memory device includes a memory cell array, which is segmented into a plurality of memory cell groups in a column direction, and a plurality of sub-word line drivers for selectively activating the sub-word line of a corresponding memory cell group in response to a group selection signal. The semiconductor memory device prevents sensing operation from occurring in a memory cell group which is not selected, while sensing operation is performed in a memory cell group which is selected by the group selection signal.

11 Claims, 5 Drawing Sheets

SEMICONDUCTOR MEMORY DEVICE WITH REDUCED SENSING NOISE AND SENSING CURRENT

BACKGROUND OF THE INVENTION

1. Field of the Invention

The present invention relates to a semiconductor memory device, and more particularly, to a semiconductor memory device having reduced sensing noise and sensing current by decreasing the number of memory cells activated by a word line.

2. Description of the Related Art

FIG. 1 shows a typical configuration of a conventional semiconductor memory device. Referring to FIG. 1, memory cells in a memory cell array 10 are arranged in a matrix form, and sub-word lines 12 and bit lines 14 for selecting memory cells to be accessed are arranged in column and row directions, respectively. A memory cell (not shown) is disposed at an intersection of a sub-word line 12 and a bit line 14.

A sub-word line driver 16 disposed below the memory cell array 10 activates one of the sub-word lines 12 in response to a pre-word line signal PW provided from a pre-word line decoder (not shown). Sense amplifiers (S/As) 18a and 18b disposed at the sides of the memory cell array 10 are connected to the bit lines 14 to read data from memory cells selected by the sub-word line and the bit lines 14. The sub-word line driver 16 drives one of the sub-word lines 12 in response to the pre-word line signal PW which is decoded by the pre-word line decoder (not shown) and a signal PX made from a row address. One of the bit lines 14 connected to the sub-word line 12 driven by the sub-word line driver 16 is selected by a column address. Memory capacity of a semiconductor memory device as shown in FIG. 1 may be increased by extending the memory cell array 10 in the row or column direction.

FIG. 2 shows a configuration of a semiconductor memory device in which a memory cell array is extended in the row direction. Referring to FIG. 2, memory cell groups 20a and 20b each having a size of n×n memory cells are arranged in the row direction. Sub-word line drivers 26a and 26b are respectively disposed below the memory cell groups 20a and 20b. Sense amplifiers 28a, 28b and 28c are disposed at the sides of the memory cell groups.

In response to a pre-word line signal PW, a signal PX and group select signals RAi/RAiB which are obtained by decoding a row address, one of the sub-word line drivers 26a and 26b drives one of the sub-word lines 22 in a memory cell group. One of bit lines 24 connected to the driven sub-word line 22 is selected by a column address.

As compared with the memory cell array of FIG. 1, the memory cell array of FIG. 2 has a disadvantage in that an area required for decoding the row address increases. To overcome this problem, a memory cell array as shown in FIG. 3 is employed.

FIG. 3 shows a configuration of a semiconductor memory device in which a memory cell array is extended in a column direction. Referring to FIG. 3, memory cell groups 30a and 30b each having a size of n×n memory cells are arranged in the column direction. A sub-word line driver 36 is disposed below the memory cell group 30a. Sense amplifiers 38a and 38b are disposed at the sides of the memory cell groups 30a and 30b. Sub-word lines 32 are commonly used in the memory cell groups 30a and 30b and driven by the sub-word line driver 36. Each sense amplifier 38a is controlled by a sense amplifier control circuit 39.

The sub-word line driver 36 drives one of the sub-word lines 32 in response to a pre-word line signal PW and a signal PX. One of bit lines 34 connected to the driven sub-word line 32 is selected by a column address and group select signals RAi and RAiB. In FIG. 3, the group select signals RAi and RAiB are used for selecting the bit line 34, not the sub-word line 32.

Compared with the device of FIG. 2, the device of FIG. 3 does not increase the area required for decoding the row address but has a disadvantage in that the number of memory cells to be sensed increases. In the memory cell array shown in FIG. 3, when one of the sub-word lines 32 is selected by the pre-word line signal PW and the signal PX, $2n$ bit lines 34 connected to the selected sub-word line 32 are activated. At this time, the group select signals RAi and RAiB are applied to a column decoder (not shown) so that either a bit line 34 in the upper memory cell group 30b or a bit line 34 in the lower memory cell group 30a is selected.

When the sub-word line 32 is activated and data in memory cells are transmitted to the $2n$ bit lines 34, $2n$ sense amplifiers 38a and 38b perform sensing operation with respect to the data in the $2n$ bit lines in response to a signal for driving the sense amplifiers 38a and 38b. In this case, while a bit line 34 in the upper memory cell group 30b is selected by a column address and the group select signal RAiB, no operation such as read or write is performed in the memory cells of the lower memory cell group 30a. However, data in the memory cells in the lower memory cell group 30a are still restored by the sense amplifiers 38a and 38b because the sub-word line 32 connected to the $2n$ bit lines of the upper and low memory cell groups 36b and 36a is selected. As a result, unnecessary sensing operation is performed in the lower memory cell group 30a. This causes sensing noise and sensing current to increase. In a like manner, such unnecessary sensing operation also occurs in the upper memory cell group 30b, when the lower memory cell group 30a is selected by the group select signal RAi.

SUMMARY OF THE INVENTION

It is an object of the present invention to provide a semiconductor memory device having reduced sensing noise and sensing current by preventing unnecessary sensing operation from occurring in a memory cell group which is not selected.

To achieve the above and other objects of the present invention, there is provided a semiconductor memory device including a plurality of memory cell groups obtained by segmenting a memory cell array in a column direction, each memory cell group being selected by a group selection signal, a plurality of sub-word line drivers for selectively activating a sub-word line of a memory cell group activated in response to the group selection signal, and a plurality of controllers for controlling sense amplifiers connected to bit lines of the plurality of memory cell groups, a controller providing driving voltages to a corresponding sense amplifier connected to the memory cell group activated in response to the group selections signal.

BRIEF DESCRIPTION OF THE DRAWINGS

The above and other objects and advantages of the present invention will become more apparent by describing in detail preferred embodiments thereof with reference to the attached drawings in which.

DESCRIPTION OF PREFERRED EMBODIMENTS

The present invention will now be described more fully with reference to the accompanying drawings, in which preferred embodiments of the invention are shown.

Figure 4:
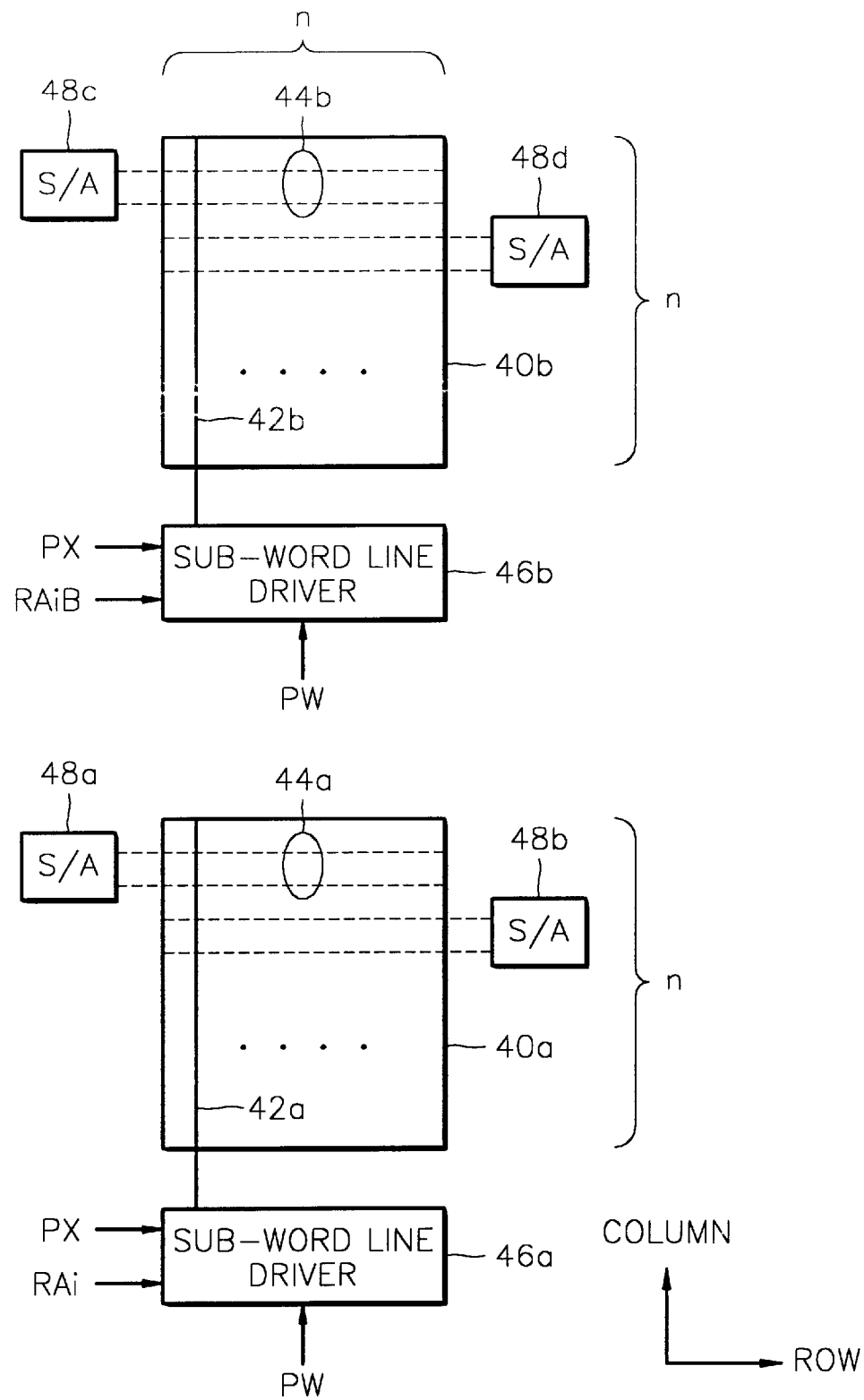
FIG. 4 is a schematic diagram showing a configuration of a semiconductor memory device according to the present invention.

As shown in FIG. 4, memory cell groups 40a and 40b each having n×n memory cells are disposed in a column direction (up and down in FIG. 4). Sub-word line drivers 46a and 46b are disposed below the respective memory cell groups 40a and 40b and activate sub-word lines 42a and 42b of the respective memory cell groups 40a and 40b. Sense amplifiers 48a, 48b, 48c and 48d are disposed at the sides of the respective memory cell groups 40a and 40b. The sub-word lines 42a and 42b and bit lines 44a and 44b are arranged in the respective memory cell groups 40a and 40b as shown in FIG. 4.

One of the sub-word line drivers 46a and 46b drives one of the sub-word lines of the corresponding memory cell group 40a or 40b in response to a pre-word line signal PW, a signal PX made from a row address and group select signals RAi/RAiB. Each of the group select signals RAi and RAiB is obtained by decoding a part of row address signals to selectively drive one of the sub-word line drivers 46a and 46b. The sub-word lines 42a and 42b of the respective memory cell groups 40a and 40b are selectively activated by the respective sub-word line drivers 46a and 46b in response to the group select signals Rai and RaiB. Thus, only n sense amplifiers associated with a selected sub-word line operate when memory cells in the memory cell groups 40a and 40b are accessed. This will be described below in more detail.

The first sub-word line driver 46a operates in response to the pre-word line signal PW, the signal PX and the first group select signal Rai, and the second sub-word line driver 46b operates in response to the pre-word line signal PW, the signal PX and the second group select signal RAiB. The first and second group select signals RAi and RAiB have opposite phases. For example, when the first group select signal RAi becomes a "high" level (hereinafter, expressed as "H"), the second group select signal RAiB becomes a "low" level (hereinafter, expressed as "L").

The first sub-word line driver 46a activates the sub-word line 42a selected by the pre-word line signal PW and the signal PX when the first group select signal RAi is activated to "H". On the other hand, the second sub-word line driver 46b activates the sub-word line 42b selected by the pre-word line signal PW and the signal PX when the second group select signal RAiB is activated to "H", while the first group select signal RAi is inactivated to "L".

Figure 1:
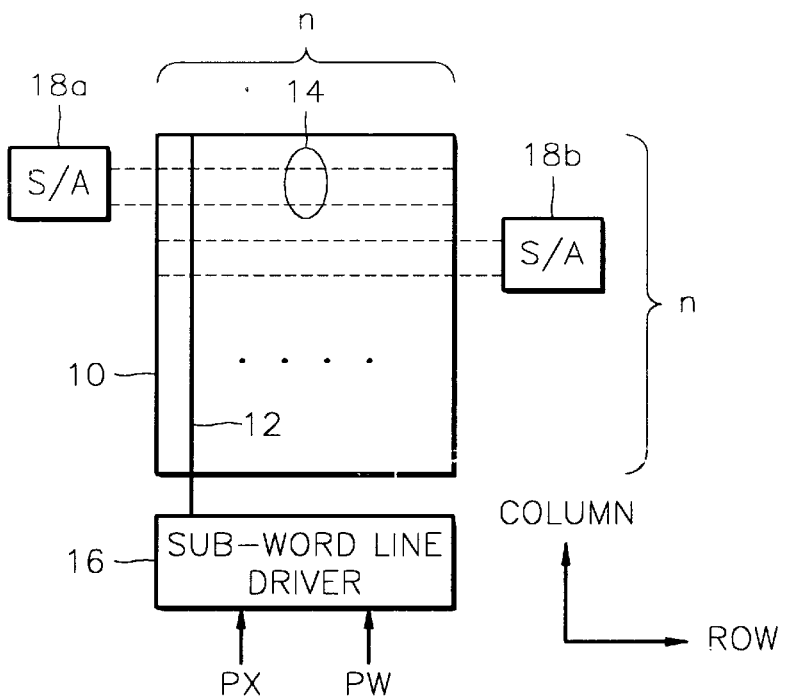
FIG. 1 is a schematic diagram showing a configuration of a conventional semiconductor memory device.
Figure 2:
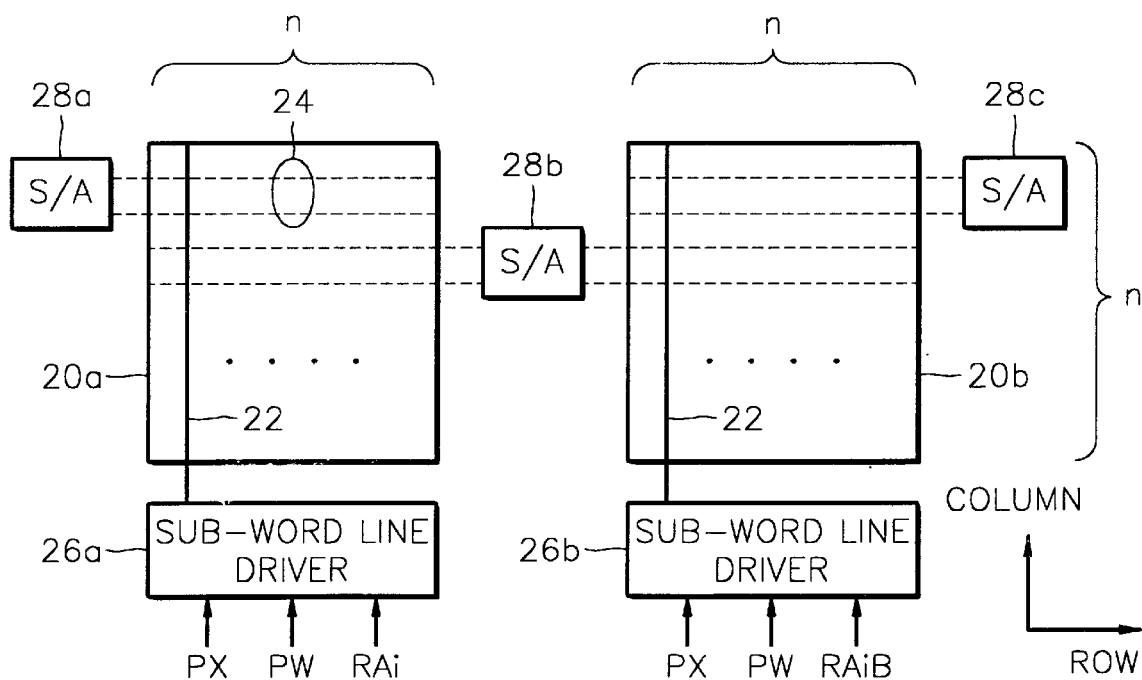
FIG. 2 is a schematic diagram showing a conventional semiconductor memory device having a memory cell array extended in a row direction.
Figure 3:
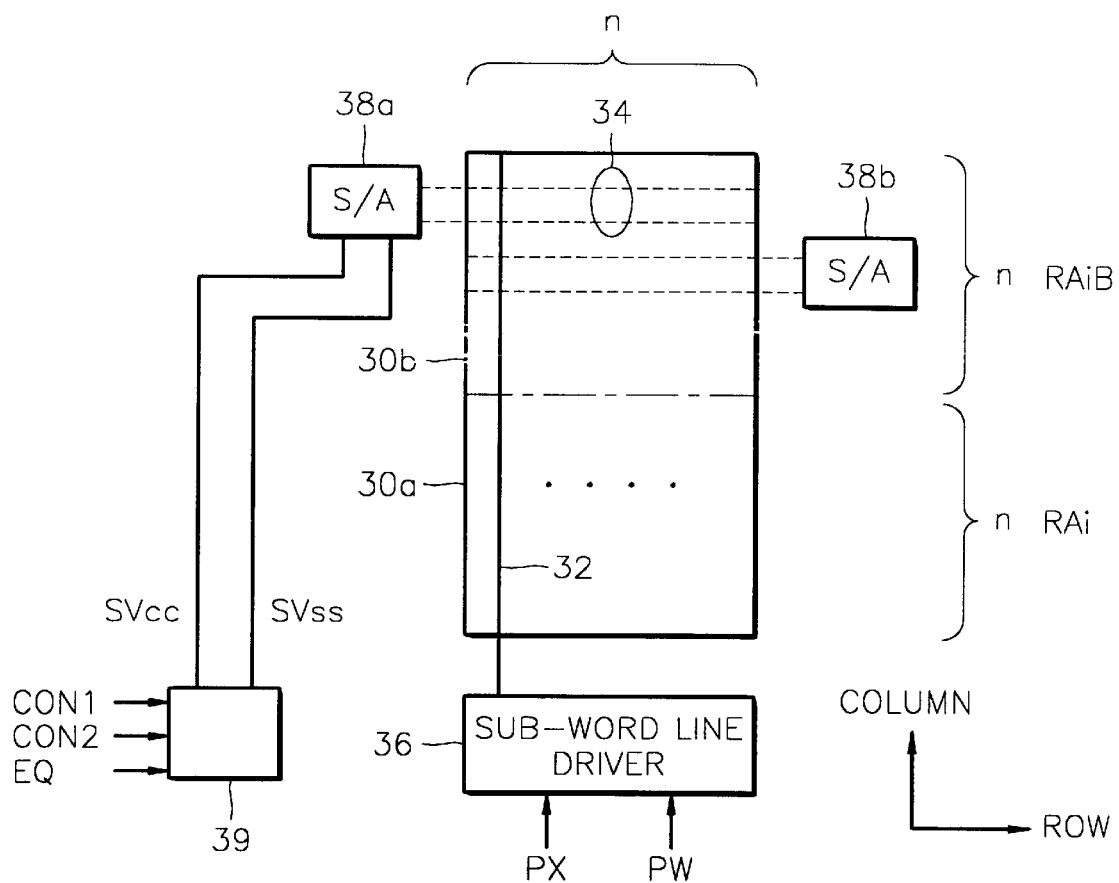
FIG. 3 is a schematic diagram showing a conventional semiconductor memory device having a memory cell array extended in a column direction.

Accordingly, when the first and second group select signals RAi and RAiB are applied, only one of the upper and lower memory cell groups 40b and 40a is activated. In other words, only n memory cells connected to one of the sub-word lines 42a and 42b are activated in accordance with the group select signals RAi and RAiB. Compared with the device in FIG. 3, only half the number of memory cells of the memory array in FIG. 4 are activated at the time of accessing the memory cells. Thus, sensing noise and sensing current in the semiconductor memory device may be reduced.

Figure 5A:
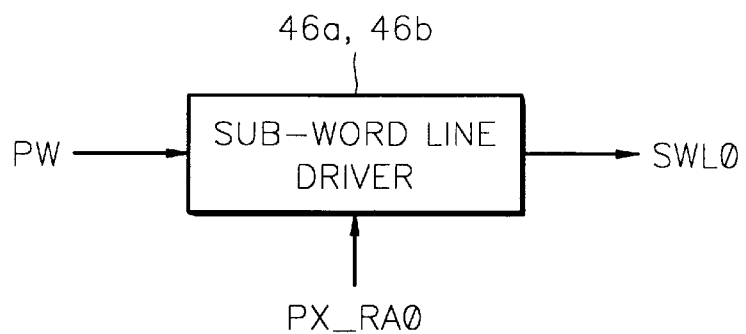
FIGS. 5A and 5B are block diagrams showing a sub-word line driver in FIG. 4.
Figure 5B:
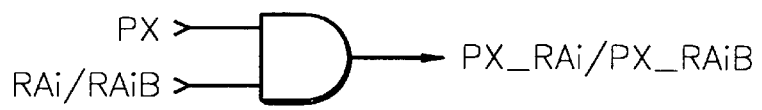

FIGS. 5A and 5B are block diagrams showing a configuration of the sub-word line driver depicted in FIG. 4. Referring to FIG. 5A, a sub-word line SWL0 is not activated until the pre-word line signal PW, which is generated by a pre-word line driver (not shown), and a signal PX__Rai or a signal PX__RAiB are enabled. For example, when the pre-word line signal PW and a signal PX__RA0 are enabled, the sub word line SWL0 is enabled in response to those signals PW and PX__RA0. As shown in FIG. 5B, the signal PX__RAiB or PX__RAi can be obtained from an AND gate which performs a logic operation with respect to the signal PX and the second group select signal RAiB or the signal PX and the first group select signal RAi.

Figure 6:
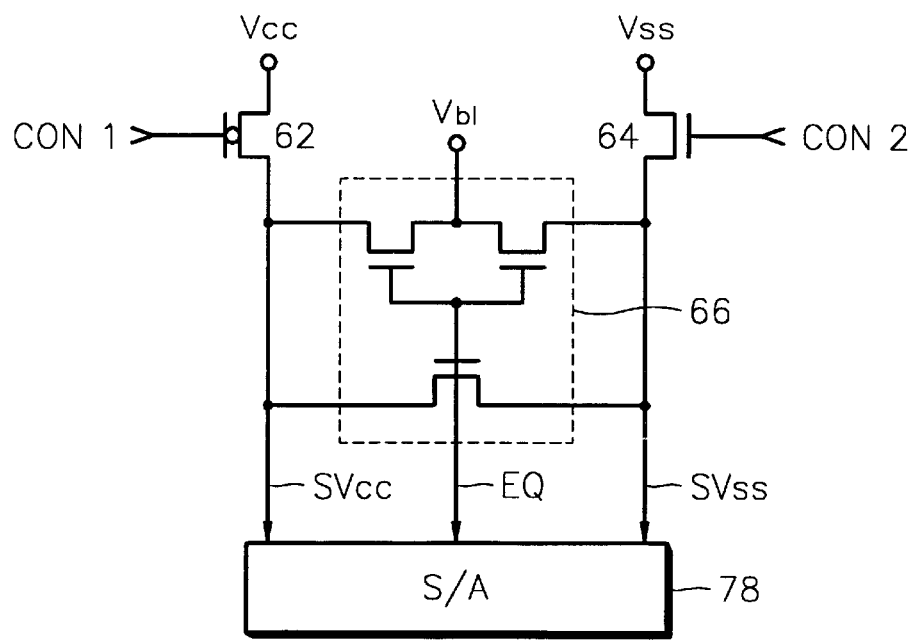
FIG. 6 is a circuit diagram showing a configuration of a sense amplifier control circuit for controlling a sense amplifier in FIG. 4.

FIG. 6 is a circuit diagram showing a configuration of a sense amplifier control circuit for controlling a sense amplifier in FIG. 4. Referring to FIG. 6, a sense amplifier control circuit includes a pull-up PMOS transistor 62, a pull-down NMOS transistor 64, an equalizer 66, and nodes SVcc and SVss for supplying driving voltages Vcc and Vss to a corresponding sense amplifier 78.

Control signals CON1 and CON2 applied to the sense amplifier control circuit have opposite phases. In case that the sense amplifier 78 amplifies data of a corresponding memory cell, a first control signal CON1 becomes a "low" level and a second control signal CON2 becomes a "high" level so that the driving voltages Vcc and Vss are transmitted to the nodes SVcc and SVss, respectively, thereby supplying the driving voltages Vcc and Vss to the sense amplifier 78. At this time, an equalization signal EQ becomes a "low" level, thereby opening a loop in which the nodes SVcc and SVss are equalized to a predetermined voltage level Vb1 until a corresponding sub-word line is enabled. On the other hand, in case that the sense amplifier 78 does not amplify data of a corresponding memory cell, the first control signal CON1 becomes a "high" level and the second control signal CON2 becomes a "low" level so that the driving voltages Vcc and Vss are not transmitted to the nodes SVcc and SVss and the equalization signal EQ becomes a "high" level, thereby equalizing the nodes SVcc and SVss to the predetermined voltage level Vb1.

Even for a memory cell group in which no sub-word line is enabled, the driving voltages Vcc and Vss are supplied to the nodes SVcc and SVss in the sense amplifier control circuit, thereby causing unnecessary bit line sensing operation in the memory cell group having no enabled sub-word line. In other words, if the second group select signal RAiB activates the second sub-word line driver 46b to enable the sub-word line 42b (referring to FIG. 4), the first and second control signals CON1 and CON2 and the equalization signal EQ become "low", "high" and "low" levels, respectively, in each sense amplifier control circuit (refer to FIG. 6), which controls each of the sense amplifiers 48c and 48d connected to the memory cell group 40b. Thus, the driving voltages Vcc and Vss are transmitted to each of the sense amplifiers 48c and 48d via the respective nodes SVcc and SVss, whereby normal sensing operation is performed. Meanwhile, in each sense amplifier control circuit which controls each of the sense amplifiers 48a and 48b connected to the memory cell group 40a, the first and second control signals CON1 and CON2 and the equalization signal EQ also respectively become "low", "high" and "low" levels although the first group signal RAi is not enabled, so that the sense amplifiers 48a and 48b perform unnecessary sensing operation. In other words, the sense amplifiers 48a and 48b operate even when the sub-word line 42a is not enabled.

Figure 7:
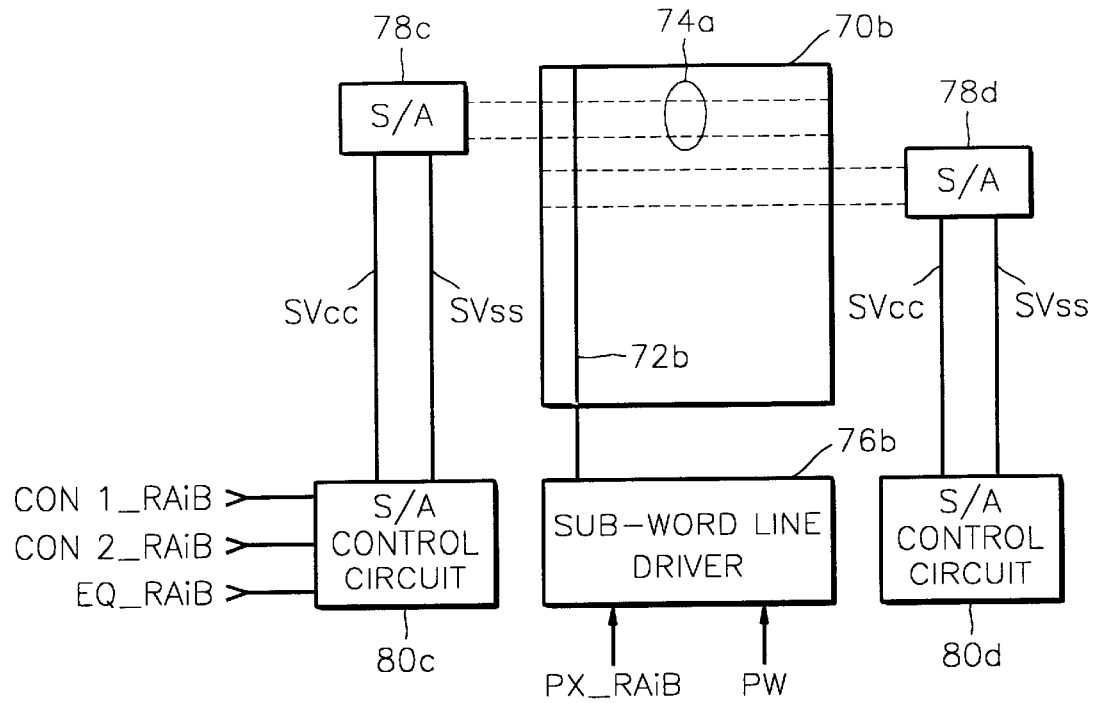
FIG. 7 is a schematic diagram of another embodiment of a semiconductor memory device according to the present invention.
Figure 7:
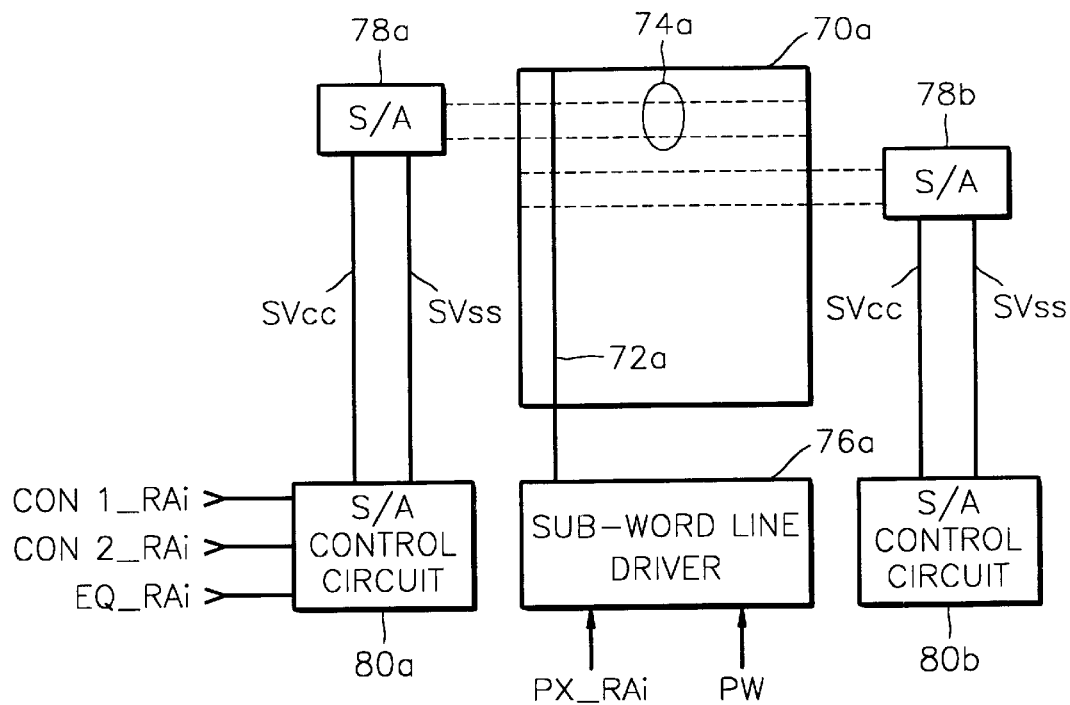

FIG. 7 is a schematic diagram showing another embodiment of a semiconductor memory device according to the present invention. FIG. 7 shows an example in which sub-word line drivers and sense amplifier control circuits are controlled by group select signals RAi and RAiB.

Referring to FIG. 7, the group select signals RAi and RAiB are used to control sense amplifier control circuits each of which controls a corresponding sense amplifier, so that sensing operation of sense amplifiers associated with a non-selected memory cell group may be prevented. For example, if the second group select signal RAiB is enabled, a sub-word line 72b of a memory cell group 70b is enabled. In this case, in each sense amplifier control circuit associated with the memory cell group 70b, a signal CON1_RAiB becomes a "low" level, a signal CON2_RAiB becomes a "high" level and a signal EQ_RAiB becomes a "low" level, so that the driving voltages Vcc and Vss are supplied to a corresponding sense amplifier which is connected to the memory cell group 70b, whereby normal sensing operation is performed in the sense amplifiers 78c and 78d connected to corresponding bit lines 74a.

On the other hand, since the first group select signal RAi is disabled to inactivate the sub-word line driver 76a, a sub-word line 72a of a memory cell group 70a is disabled. In each of the sense amplifier control circuits 80a and 80b associated with the memory cell group 70a, a signal CON1_RAi becomes a "high" level, a signal CON2_RAi becomes a "low" level and a signal EQ_RAi becomes a "high" level, so that the voltage levels in the nodes SVcc and SVss for driving a corresponding sense amplifier are equalized to a predetermined voltage level Vb1 equal to an initial bit line voltage. As a result, no sensing operation is performed in the sense amplifiers 78a and 78b connected to the memory cell group 72a.

Here, the signals CON1_RAi/CON1_RAiB, CON2_RAi/CON2_RAiB and EQ_RAi/EQ_RAiB are obtained by performing logic operations with respect to the control signals CON1 and CON2, the equalization signal EQ and the group select signals RAi/RAiB.

Therefore, a semiconductor memory device of the present invention prevents unnecessary sensing operation from occurring in a memory cell group which is not selected, thereby reducing sensing noise and sensing current in the semiconductor memory device.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A semiconductor memory device including a memory cell array in which memory cells are disposed in row and column directions, the semiconductor memory device comprising:

a plurality of memory cell groups obtained by segmenting the memory cell array;

a plurality of sub-word line drivers each of which is associated with each of the plurality of memory cell groups and selectively drives a plurality of sub-word lines of a memory cell group, wherein the plurality of sub-word line drivers are selectively enabled in response to a set of group selection signals so that a sub-word line selected by an enabled sub-word line driver is activated;

a plurality of sense amplifiers for sensing data in the memory cells; and a plurality of controllers for controlling the plurality of sense amplifiers, respectively, wherein the plurality of controllers are selectively enabled in response to the set of group selection signals so that enabled controllers provide driving voltages to corresponding sense amplifiers to sense data in bit lines connected to the sub-word line selected by the enabled sub-word line driver.

2. The semiconductor memory device of claim 1, wherein each of the plurality of controllers includes:

nodes generating the driving voltages to a sense amplifier in response to a group selection signal to enable a corresponding controller; and an equalizer for equalizing voltage levels of the nodes to a predetermined voltage level in response to a group selection signal to disable the corresponding controller.

3. The semiconductor memory device of claim 2, wherein the predetermined voltage level is substantially equal to an initial bit line voltage level.

4. The semiconductor memory device of claim 1, wherein the memory cell array is segmented into the plurality of memory cell groups in a column direction.

5. The semiconductor memory device of claim 1, wherein the enabled sub-word line driver receives a group selection signal having a first value, and sub-word line drivers other than the enabled sub-word line driver receive group selection signals, respectively, having a second value.

6. The semiconductor memory device of claim 1, wherein the enabled controllers receive a group selection signal which is provided to the enabled sub-word line driver.

7. A semiconductor memory device comprising:

first and second memory cell groups each having bit lines and sub-word lines for selecting memory cells;

first and second sub-word line drivers connected to the first and second memory cell groups, respectively, the first and second sub-word line drivers receiving first and second group selection signals, respectively;

a plurality of sense amplifiers each of which is connected to each of the bit lines of the first and second memory cell groups; and a plurality of sense amplifier controllers connected to the plurality of sense amplifiers, respectively, wherein sense amplifier controllers associated with the first memory cell group receive the first group selection signal, and sense amplifier controllers associated with the second memory cell group receive the second group selection signal, wherein the first sub-word line driver activates a sub-word line of the first memory cell group in response to the first group selection signal, and the sense amplifier controllers associated with the first memory cell group provide driving voltages to corresponding sense amplifiers in response to the first group selection signal.

8. The semiconductor memory device of claim 7, wherein the second sub-word line driver disables a sub-word line of the second memory cell group in response to the second group selection signal, and the sense amplifier controllers associated with the second memory cell group provide an equalization signal to corresponding sense amplifiers in response to the second group selection signal.

9. The semiconductor memory device of claim 7, wherein the first and second group selection signals are obtained by decoding a row address applied to the semiconductor memory device.

10. The semiconductor memory device of claim 7, wherein the first and second memory cell groups are obtained by equally segmenting a memory cell array into two parts.

11. The semiconductor memory device of claim 8, wherein each of the plurality of sense amplifier controllers includes:
- nodes for generating the driving voltages in response to the first group selection signal; and
- an equalizer for equalizing voltage levels of the nodes to a predetermined voltage level in response to the second group selection signal.

* * * * *